(12) United States Patent
Choi et al.

(10) Patent No.: US 9,419,027 B2
(45) Date of Patent: Aug. 16, 2016

(54) ARRAY SUBSTRATE, METHOD FOR FABRICATING THE SAME AND DISPLAY DEVICE

(71) Applicant: BOE Technology Group Co., Ltd., Beijing (CN)

(72) Inventors: Seungjin Choi, Beijing (CN); Heecheol Kim, Beijing (CN); Youngsuk Song, Beijing (CN); Seongyeol Yoo, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 14/802,241

(22) Filed: Jul. 17, 2015

(65) Prior Publication Data

US 2015/0325603 A1 Nov. 12, 2015

Related U.S. Application Data

(62) Division of application No. 14/345,864, filed as application No. PCT/CN2013/089596 on Dec. 16, 2013, now Pat. No. 9,117,707.

(30) Foreign Application Priority Data

May 30, 2013 (CN) .......................... 2013 1 0211125

(51) Int. Cl.
*H01L 27/12* (2006.01)
*H01L 21/311* (2006.01)
(Continued)

(52) U.S. Cl.
CPC ...... *H01L 27/1259* (2013.01); *G02F 1/133345* (2013.01); *G02F 1/134309* (2013.01);
(Continued)

(58) Field of Classification Search
CPC ........................... H01L 27/1259; H01L 27/12
USPC ......................................................... 257/72
See application file for complete search history.

(56) References Cited

U.S. PATENT DOCUMENTS 6,660,567 B2  12/2003 Choo et al.
7,342,252 B2  3/2008 Son
(Continued)

FOREIGN PATENT DOCUMENTS

CN  101900913 A  12/2010
CN  101995707 A  3/2011
(Continued)

OTHER PUBLICATIONS

English translation of the Written Opinion of the International Searching Authority of PCT/CN2013/089596, mailed Mar. 27, 2014.
(Continued)

*Primary Examiner* — Marc Armand
(74) *Attorney, Agent, or Firm* — Collard & Roe, P.C.

(57) ABSTRACT

An array substrate, a method for fabricating the same and a display device are disclosed. The array substrate comprises a plurality of gate lines and a plurality of data lines which intersect each other to define a plurality of pixel regions, each of the pixel regions comprises a thin film transistor and further comprises: a base substrate; more than one protrusion disposed apart from each other on the base substrate; a first electrode layer comprising at least one first electrode strip disposed in a gap between adjacent protrusions; a second electrode layer comprising at least one second electrode strip disposed on the protrusions.

14 Claims, 5 Drawing Sheets

(51) Int. Cl.
*H01L 21/3213* (2006.01)
*G02F 1/1333* (2006.01)
*G02F 1/1343* (2006.01)
*H01L 27/32* (2006.01)

(52) U.S. Cl.
CPC .... *G02F1/134363* (2013.01); *H01L 21/31127* (2013.01); *H01L 21/32133* (2013.01); *H01L 27/124* (2013.01); *H01L 27/1248* (2013.01); *G02F 2001/134372* (2013.01); *G02F 2001/134381* (2013.01); *G02F 2201/124* (2013.01); *H01L 27/1218* (2013.01); *H01L 27/3244* (2013.01)

(56) References Cited

U.S. PATENT DOCUMENTS

| | | | |
|---|---|---|---|
| 7,385,661 | B2 | 6/2008 | Chae |
| 7,525,623 | B2 | 4/2009 | Kim et al. |
| 7,656,496 | B2 | 2/2010 | Kim et al. |
| 7,696,529 | B2 | 4/2010 | Choo et al. |
| 7,719,654 | B2 | 5/2010 | Heo et al. |
| 8,179,503 | B2 | 5/2012 | Chen |
| 8,319,924 | B2 | 11/2012 | Kim et al. |
| 8,492,765 | B2 | 7/2013 | Seong et al. |
| 8,654,292 | B2 | 2/2014 | Kubota et al. |
| 8,704,962 | B2 | 4/2014 | Oh et al. |
| 9,117,707 | B2 | 8/2015 | Choi et al. |
| 2005/0094063 | A1 | 5/2005 | Lee et al. |
| 2005/0243228 | A1* | 11/2005 | Lee et al. ............... 349/42 |
| 2006/0157711 | A1 | 7/2006 | Kang |
| 2009/0166633 | A1 | 7/2009 | Lee et al. |
| 2009/0284707 | A1 | 11/2009 | Cho et al. |
| 2009/0322975 | A1 | 12/2009 | Song et al. |
| 2010/0038648 | A1* | 2/2010 | Cho et al. ............... 257/72 |
| 2010/0213463 | A1 | 8/2010 | Park et al. |
| 2010/0245752 | A1 | 9/2010 | Hong et al. |
| 2014/0054581 | A1 | 2/2014 | Song et al. |
| 2014/0077160 | A1 | 3/2014 | Dai et al. |
| 2014/0077213 | A1 | 3/2014 | Zhang et al. |
| 2014/0131803 | A1 | 5/2014 | Cheng et al. |
| 2015/0070616 | A1 | 3/2015 | Ogasawara et al. |

FOREIGN PATENT DOCUMENTS

| | | |
|---|---|---|
| CN | ON103018979 A | 4/2013 |
| CN | 103309095 A | 9/2013 |
| WO | 2014/190733 A1 | 12/2014 |

OTHER PUBLICATIONS

International Search Report, International Preliminary Report on Patentability and Written Opinion of the InternationalSearching Authority of PCT/CN2013/089596 in Chinese, mailed Mar. 27, 2014.

International Search Report of PCT/CN2013/089596 in English, Published with Application Publication Dec. 4, 2014.

\* cited by examiner

ARRAY SUBSTRATE, METHOD FOR FABRICATING THE SAME AND DISPLAY DEVICE

CROSS REFERENCE TO RELATED APPLICATIONS

This application is a divisional of U.S. patent application Ser. No. 14/345,864 and Applicants claim priority under 35 U.S.C. §§120 and 121 of U.S. application Ser. No. 14/345,864 filed on Apr. 3, 2014, which application is a national stage application under 35 U.S.C. §371 of PCT Application No. PCT/CN2013/089596 filed Dec. 16, 2013 which claims priority under 35 U.S.C. §119 from Chinese Patent Application No. 201310211125.4 filed May 30, 2013, the disclosures of each of which are hereby incorporated by reference. A certified copy of priority Chinese Patent Application No. 201310211125.4 is contained in parent U.S. application Ser. No. 14/345,864. The International Application under PCT article 21(2) was not published in English.

FIELD OF THE ART

Embodiments of the invention relate to the field of liquid crystal displays, more particularly, to an array substrate, a method for fabricating the same and a display device.

BACKGROUND

Typical liquid crystal displays (LCDs) in conventional technologies are Advanced-Super Dimensional Switching (AD-SDS, also abbreviated as ADS) LCD, In Plane Switch (IPS) LCD and Twist Nematic (TN) LCD. In an ADS display device, a multi-dimensional electric field is formed with both a parallel electric field produced at edges of pixel electrodes on the same plane and a vertical electric field produced between a pixel electrode layer and a common electrode layer, such that liquid crystal molecules at all orientations, which are located directly above the electrodes and between the pixel electrodes in a liquid crystal cell, can be rotated.

In a conventional ADS display device, the pixel electrode and the common electrode have a large overlapping area and a small space between them, which renders storage capacitance Cst very large, thereby causing many constraints to the design. Currently, the pixel electrode and the common electrode are alternately disposed so as to tackle the problem of having too large a Cst. However, in general cases, a very high precision for the exposure process may be required, because the alternative disposition of the pixel electrode and the common electrode is only fabricated by a patterning process using a mask, which will inevitably increase the difficulty in controlling the equipment and the process, and increase the cost.

SUMMARY

Embodiments of the invention provide an array substrate, a method for fabricating the same and a display device, which can reduce the fabrication cost and the difficulty of the fabrication processes.

To this end, embodiments of the invention make use of the following technical solutions:

A first aspect of the invention provides an array substrate comprising a plurality of gate lines and a plurality of data lines which intersect each other to define a plurality of pixel regions, each of the pixel regions comprises a thin film transistor (TFT) and further comprises:

a base substrate; more than one protrusion disposed apart from each other on the base substrate;

a first electrode layer comprising at least one first electrode strip disposed in a gap between adjacent protrusions;

a second electrode layer comprising at least one second electrode strip disposed above the protrusions.

As an example, the pixel region further comprises an insulation layer disposed between the first electrode layer and the second electrode layer.

As an example, the more than one protrusion on the base substrate is equally spaced apart from each other.

As an example, there is a plurality of protrusions, the first electrode strip is disposed in each gap between the plurality of protrusions, and the second electrode strip is disposed above each of the plurality of protrusions.

As an example, the TFT comprises a gate electrode, a gate insulation layer, an active layer, a source electrode and a drain electrode.

As an example, the gate insulation layer is disposed between the first electrode layer and the second electrode layer;

the first electrode layer is connected to the drain electrode by way of a via hole in the gate insulation layer.

As an example, the array substrate further comprises a passivation layer, the gate insulation layer is disposed under the first electrode layer, the passivation layer is disposed between the first electrode layer and the second electrode layer;

the first electrode layer is directly connected to the drain electrode.

As an example, the array substrate further comprises a passivation layer disposed between the first electrode and the second electrode;

the second electrode layer is connected to the drain electrode by way of a via hole in the passivation layer.

As an example, the array substrate further comprises a passivation layer, the gate insulation layer is disposed between the first electrode layer and the second electrode layer, the passivation layer is disposed above the second electrode;

the second electrode layer is directly connected to the drain electrode.

As an example, a material of the protrusion is transparent resin material, and a thickness of the protrusion is larger than that of the first electrode.

A second aspect of the invention provides a method for fabricating an array substrate, comprising forming gate lines, data lines and a TFT on a base substrate, the method further comprises:

forming more than one protrusion disposed apart from each other on the base substrate;

forming a first electrode layer, the first electrode layer comprises at least one first electrode strip disposed in a gap between adjacent protrusions;

forming a second electrode layer, the second electrode layer comprises at least one second electrode strip disposed above the protrusions.

As an example, the method further comprises fabricating an insulation layer between the first electrode layer and the second electrode layer.

As an example, the method comprises:

fabricating more than one protrusion disposed apart from each other on the base substrate;

fabricating a first transparent conductive film on the substrate having the protrusions formed thereon and coating a first photoresist on the substrate having the first transparent conductive film fabricated thereon;

performing an ashing process on the first photoresist to form a pattern of the first photoresist which covers only the gaps between the protrusions;

performing an etching process to remove the first transparent conductive film not covered by the pattern of the first photoresist;

performing a photoresist peeling process on the pattern of the first photoresist to form the first electrode layer comprising at least one first electrode strip;

fabricating an insulation layer on the base substrate having the first electrode layer formed thereon;

coating a second photoresist on the substrate having the insulation layer formed thereon, ashing the second photoresist to form a pattern of the second photoresist which covers only the gaps between the protrusions;

fabricating a second transparent conductive film on the substrate having the pattern of the second photoresist formed thereon, then removing the pattern of the second photoresist and the second transparent conductive film on the pattern of the second photoresist through a photoresist peeling process to form the second electrode layer comprising at least one second electrode strip.

As an example, the TFT comprises a gate electrode, a gate insulation layer, an active layer, a source electrode and a drain electrode;

the insulation comprises at least one of the gate insulation layer or a passivation layer;

the first electrode layer is connected to the drain electrode, or the second electrode layer is connected to the drain electrode.

As an example, the protrusions fabricated on the base substrate are equally spaced apart from each other.

As an example, a material of the protrusion is transparent resin material, and a thickness of the protrusion is larger than that of the first electrode.

A third aspect of the invention provides a display device comprising the above array substrates.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

NUMERAL REFERENCES 1-common electrode; 2-pixel electrode; 11-base substrate; 12-first electrode layer; 13-second electrode layer; 110-protrusion; 120-first electrode strip; 130-second electrode strip; 12a-first transparent conductive film; 12b-first photoresist; 12c-pattern of the first photoresist; 13a-second transparent conductive film; 13b-second photoresist; 13c-pattern of the second photoresist; 14-gate electrode; 15-gate insulation layer; 16-active layer; 17-source/drain electrode; 18-passivation layer.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 2:
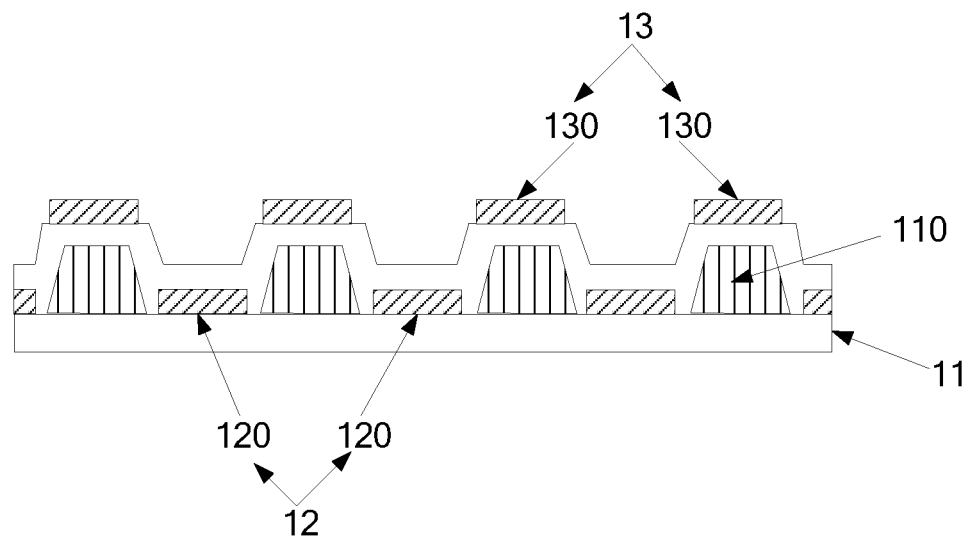
FIG. 2 schematically illustrates a cross section of an array substrate in accordance with an embodiment of the invention.

An embodiment of the invention provides an array substrate, which comprises a plurality of gate lines and a plurality of data lines which intersect each other to define a plurality of pixel regions, each of the pixel regions comprises a thin film transistor (TFT). As illustrated in FIG. 2, the pixel region further comprises: a base substrate 11; more than one protrusion 110 disposed on the base substrate 11; a first electrode layer 12, which comprises at least one first electrode strip 120 disposed in a gap between adjacent protrusions 110; a second electrode layer 13, which comprises at least one second electrode strip 130 disposed above the protrusions 110.

In the array substrate as provided by the embodiment of the invention, the base substrate of the array substrate is designed as a base substrate having grooves, the first electrode layer is disposed inside the grooves and the second electrode layer disposed outside the groove, thereby ensuring no overlapping between the two electrode layers by using the protrusions on the base substrate, which reduces the fabrication cost and the difficulty of the fabrication process.

As an example, the protrusions 110 disposed on the base substrate are equally spaced apart from each other.

As an example, a depth of the protrusions 110 is larger than a thickness of the first electrode layer.

As an example, as illustrated in FIG. 2, a first electrode strip 120 is disposed in each gap between the protrusions 110, and a second electrode strip 130 is disposed above each of the protrusions.

As an example, the pixel region further comprises an insulation layer disposed between the first electrode layer 12 and the second electrode layer 13.

In the array substrate as provided by the embodiment of the invention, one of the first and the second electrode layer has to function as the pixel electrode connected to the drain electrode. It may be the first electrode layer that is connected to the drain electrode, or it may be the second electrode layer that is connected to the drain electrode. It is noted here that the electrode electrically connected to the common electrode line is a common electrode and the other electrode electrically connected to the drain electrode of the TFT is a pixel electrode, regardless of the electrode being the first electrode layer or the second electrode layer.

As an example, the TFT comprises a gate electrode, a gate insulation layer, an active layer, a source electrode and a drain electrode. Optionally, the first electrode layer may be connected to the drain electrode, that is, the first electrode layer is the pixel electrode and the second electrode layer is the common electrode. In this case, there are two situations as follows.

Figure 11A:
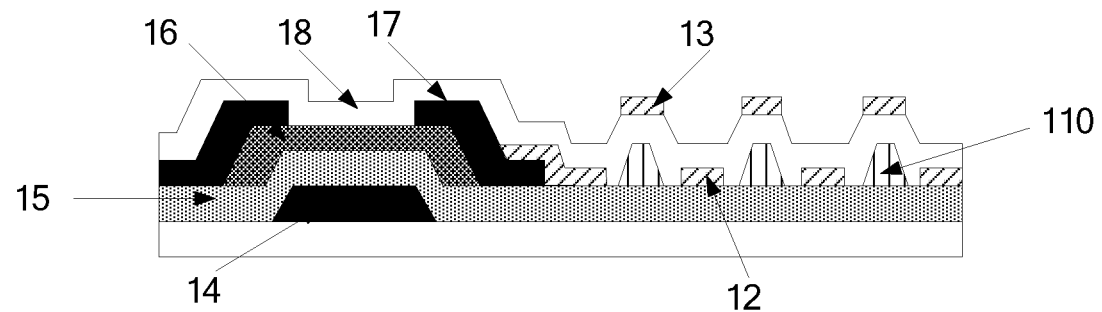
FIGS. 11a-11d illustrates various position relationships between a first and a second electrode layer of an array substrate.
Figure 11B:
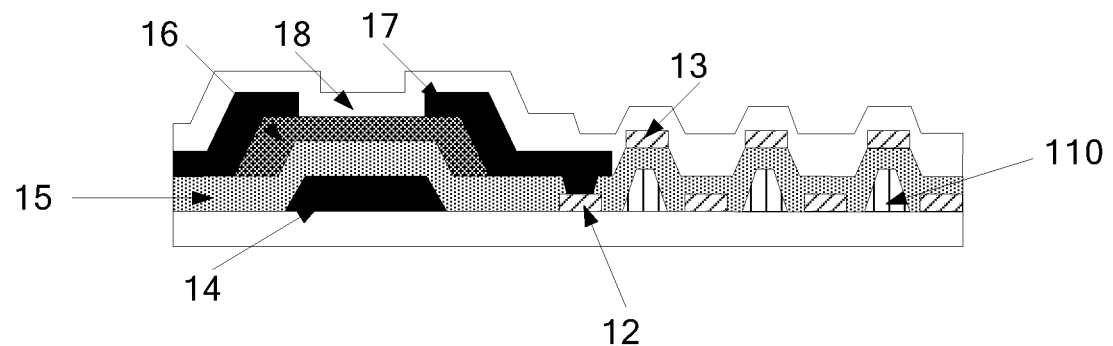

In one situation, the first electrode layer is directly connected to the drain electrode. In this case, the TFT is formed on the array substrate first, and then the first electrode layer, the passivation layer and the second electrode layer are sequentially formed with the passivation layer disposed between the first electrode layer and the second electrode layer. At the moment, the first electrode layer is disposed above the gate insulation layer and no other layered structure is sandwiched between the first electrode layer and the drain electrode; as a result, the first electrode layer is overlap jointed to the drain electrode (as illustrated in FIG. 11*a*). In the other situation, the first electrode layer is connected to the drain electrode by way of a via hole in the gate insulation layer. In this case, the first electrode layer is first fabricated on the array substrate before forming the TFT, and then the passivation layer and the second electrode layer are fabricated. The gate insulation layer is formed between the first and the second electrode layers. At the moment, the gate insulation layer is disposed above the first electrode layer, the via hole made in the gate insulation layer is located above the first electrode layer, the drain electrode may be connected to the first electrode layer by way of the via hole in the gate insulation layer (as illustrated in FIG. 11*b*).

Optionally, the second electrode layer may be connected to the drain electrode, that is, the second electrode layer is the pixel electrode and the first electrode layer is the common electrode. In this case, there are two situations as follows.

Figure 11C:
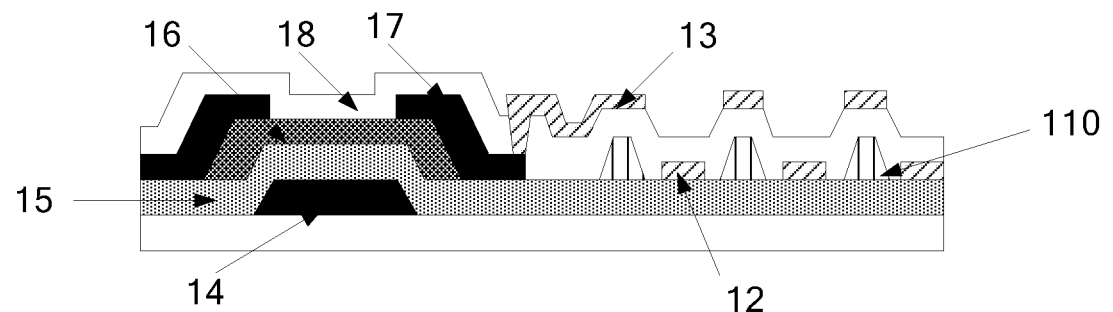
Figure 11D:
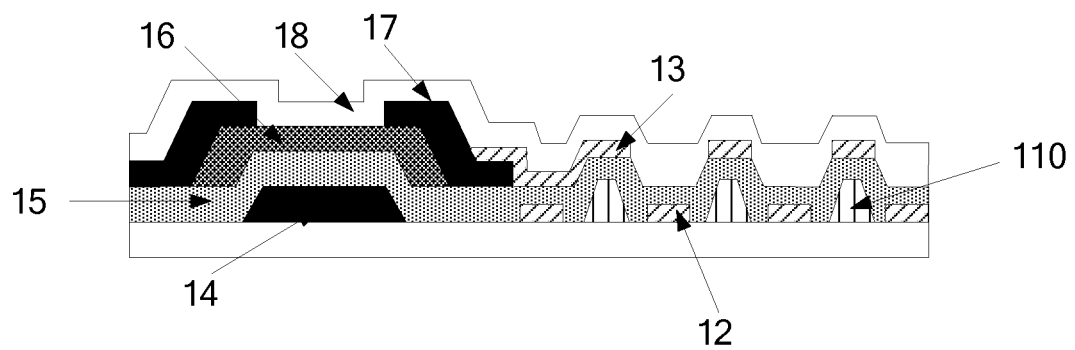

In one situation, the second electrode layer is connected to the drain electrode by way of a via hole in the passivation layer. In this case, the passivation layer is formed on the array substrate before forming the second electrode layer, the second electrode layer is disposed over the passivation layer, the via hole made in the passivation layer is located above the drain electrode, the second electrode layer may be connected to the drain electrode by way of the via hole in the passivation layer (as illustrated in FIG. 11*c*). In the other situation, the second electrode layer is directly connected to the drain electrode. In this case, the first electrode layer is formed on the array substrate before forming the TFT, and then the second electrode layer and the passivation are sequentially formed. The second electrode layer is disposed under the passivation layer, no other layered structure is sandwiched between the second electrode layer and the drain electrode, and the second electrode layer may be overlap jointed directly to the drain electrode (as illustrated in FIG. 11*d*).

Another embodiment of the invention further provides a method for fabricating an array substrate, comprising forming gate lines, data lines and a TFT on a base substrate, the method further comprises:

forming more than one protrusion disposed apart from each other on the base substrate;

forming a first electrode layer, the first electrode layer comprises at least one first electrode strip disposed in a gap between adjacent protrusions;

forming a second electrode layer, the second electrode layer comprises at least one second electrode strip disposed above the protrusions.

Figure 3:
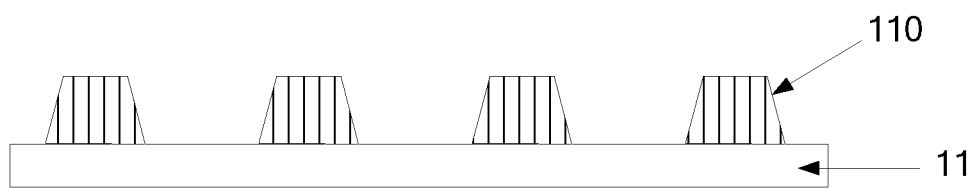
FIG. 3 schematically illustrates a first cross section of an array substrate during a procedure of a method for fabricating an array substrate in accordance with an embodiment of the invention.

As an example, the gate lines, the data lines and TFT in non-display region are fabricated by referring to a conventional process; the method for forming the two electrode layers in display region of the array substrate comprises the following steps:

S1, with reference to FIG. 3, forming a resin layer on the base substrate 11, and then forming more than one protrusion 110 on the base substrate 11 through a patterning process. As an example, the protrusions 110 formed on the base substrate 11 are equally spaced apart from each other.

Figure 4:
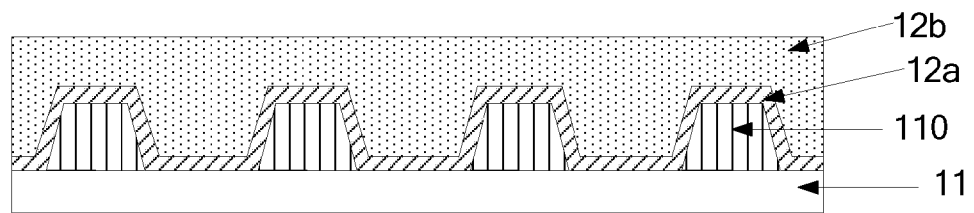
FIG. 4 schematically illustrates a second cross section of an array substrate during a procedure of a method for fabricating an array substrate in accordance with an embodiment of the invention.

S2, with reference to FIG. 4, forming a first transparent conductive film 12*a* on the base substrate 11 of FIG. 3, and coating a first photoresist 12*b* on the substrate having the first transparent conductive film 12*a* formed thereon.

Figure 5:
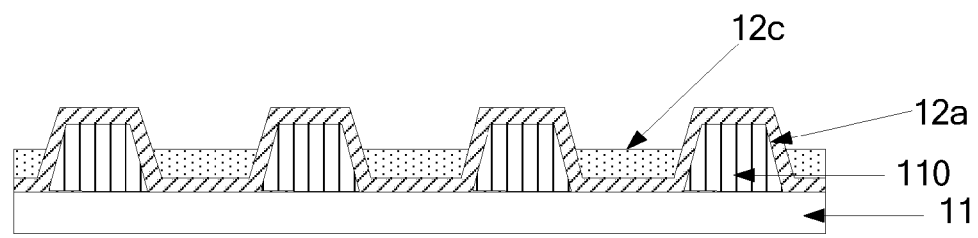
FIG. 5 schematically illustrates a third cross section of an array substrate during a procedure of a method for fabricating an array substrate in accordance with an embodiment of the invention.

S3, with reference to FIG. 5, performing an ashing process on the first photoresist 12*b* to form a pattern of the first photoresist 12*c* which covers only the gaps between the protrusions 110.

Figure 6:
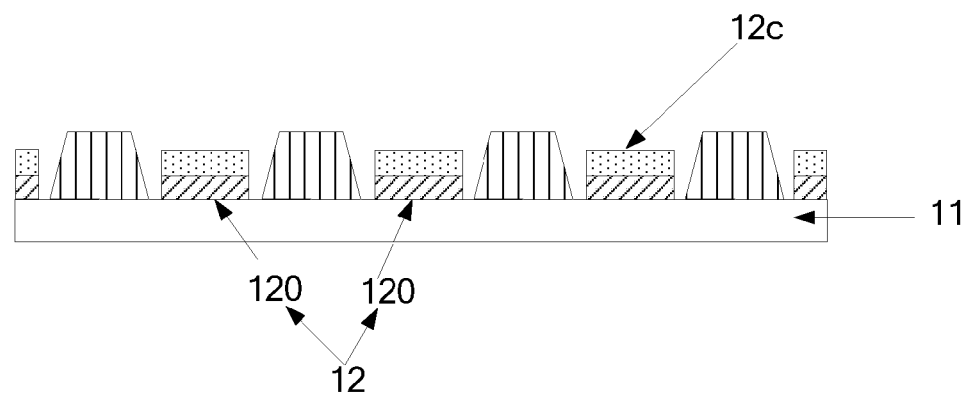
FIG. 6 schematically illustrates a fourth cross section of an array substrate during a procedure of a method for fabricating an array substrate in accordance with an embodiment of the invention.

S4: performing an etching process to remove the first transparent conductive film not covered by the pattern of the first photoresist 12*c*, with reference to FIG. 6, forming the first electrode layer 12 comprising a plurality of conductive first electrode strips 120 in the grooves (constituted of the gaps between the protrusions, for example) on the substrate. As an example, a thickness of the protrusions 110 is larger than that of the first electrode layer 12.

Figure 7:
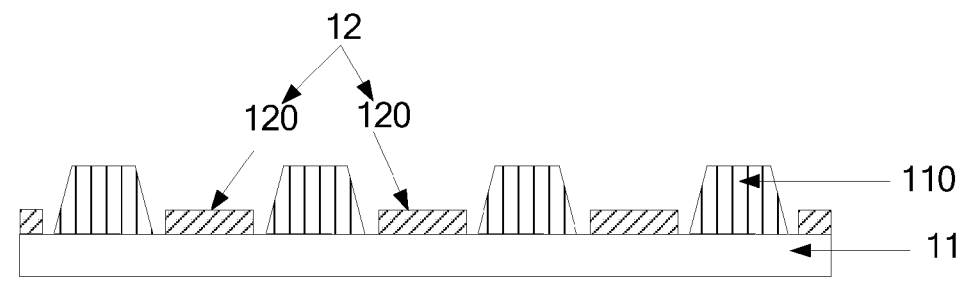
FIG. 7 schematically illustrates a fifth cross section of an array substrate during a procedure of a method for fabricating an array substrate in accordance with an embodiment of the invention.

S5, performing a photoresist peeling process on the pattern of the first photoresist to form the base substrate as illustrated in FIG. 7.

Figure 8:
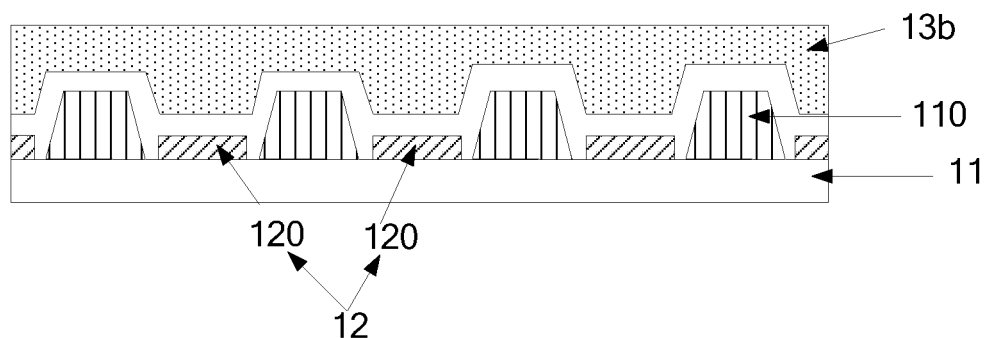
FIG. 8 schematically illustrates a sixth cross section of an array substrate during a procedure of a method for fabricating an array substrate in accordance with an embodiment of the invention.

S6, forming an insulation layer on the base substrate having the first electrode layer 12 formed thereon, and then coating a second photoresist 13b on the substrate having the insulation layer formed thereon to form the base substrate as illustrated in FIG. 8. It is noted here that the insulation layer is for example the gate insulation layer or the passivation layer.

Figure 9:
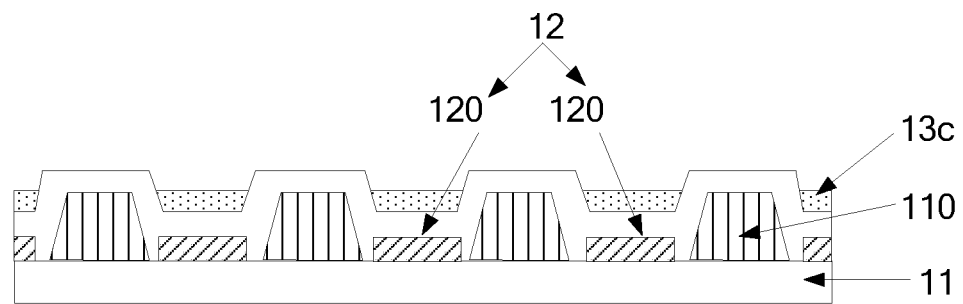
FIG. 9 schematically illustrates a seventh cross section of an array substrate during a procedure of a method for fabricating an array substrate in accordance with an embodiment of the invention.

S7, performing an ashing process on the second photoresist 13b to form a pattern of the second photoresist 13c as illustrated in FIG. 9 which covers only the gaps between the protrusions 110.

Figure 10:
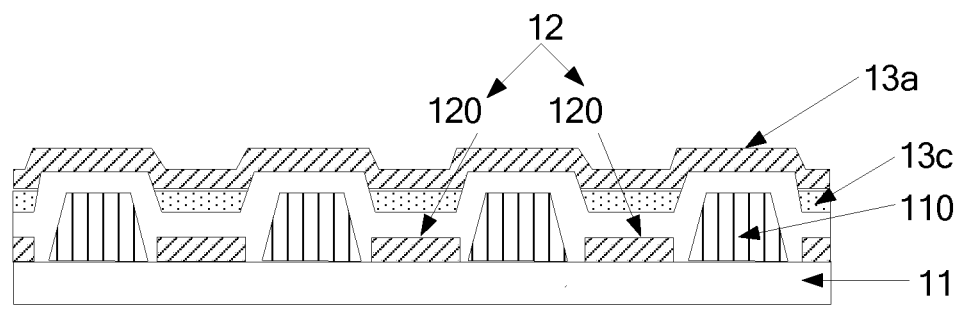
FIG. 10 schematically illustrates a eighth cross section of an array substrate during a procedure of a method for fabricating an array substrate in accordance with an embodiment of the invention.

S8, with reference to FIG. 10, forming a second transparent conductive film 13a on the substrate having the pattern of the second photoresist 13c formed thereon.

S9, removing the pattern of the second photoresist 13c and the second transparent conductive film on the pattern of the second photoresist through a photoresist peeling process, to form the second electrode layer 13 comprising the plurality of conductive second electrode strips 130 as illustrated in FIG. 2.

Herein, the fabricated first electrode layer is connected to the drain electrode; or the fabricated second electrode layer is connected to the drain electrode. It is noted here that the electrode electrically connected to the common electrode line is the common electrode and the other electrode electrically connected to the drain electrode of the TFT is the pixel electrode, regardless of being the first electrode layer or the second electrode layer.

If the fabricated first electrode layer is connected to the drain electrode and it is directly connected to the drain electrode, then the fabrication method comprises: subsequent to step S1, fabricating the TFT in the non-display region of the array substrate by referring to a conventional process, the TFT comprises a gate electrode, a gate insulation layer, an active layer, a source electrode and a drain electrode; then, steps S2-S5 are sequentially performed to fabricate the first electrode layer, which may be fabricated directly on the drain electrode; finally, the passivation layer may be formed first, and then the steps S6-S10 are sequentially performed to fabricate the second electrode layer. In this case, the insulation layer is the passivation layer.

If the fabricated first electrode layer is connected to the drain electrode and it is connected to the drain electrode by way of a via hole in the gate insulation layer, then the fabrication method comprises: performing steps S1-S5 first to fabricate the first electrode layer; then fabricating the TFT in the non-display region of the array substrate by referring to a conventional process, the TFT comprises a gate electrode, a gate insulation layer, an active layer, a source electrode and a drain electrode. Herein, the gate insulation layer comprising the via hole may be fabricated through a patterning process when fabricating the gate insulation layer; since the via hole in the gate insulation layer is formed above the first electrode layer, the fabricated drain electrode may be connected to the first electrode layer by way of the via hole in the gate insulation layer. Finally, the passivation layer may be formed first, and then the steps S6-S10 are sequentially performed to fabricate the second electrode layer. Alternatively, it may sequentially perform steps S6-S10 first to fabricate the second electrode layer, followed by fabricating the passivation layer. In this case, the insulation layer is the gate insulation layer; or the insulation layer is the gate insulation layer and the passivation layer.

If the fabricated second electrode layer is connected to the drain electrode and it is directly connected to the drain electrode, then the fabrication method comprises: performing steps S1-S5 first to fabricate the first electrode layer; then fabricating the TFT in the non-display region of the array substrate by referring to a conventional process, the TFT comprises a gate electrode, a gate insulation layer, an active layer, a source electrode and a drain electrode. Next, steps S6-S10 are performed to fabricate the second electrode layer, which may be formed directly on the drain electrode. Finally, the passivation layer is fabricated. In this case, the insulation layer is the gate insulation layer.

If the fabricated second electrode layer is connected to the drain electrode and it is connected to the drain electrode by way of the via hole in the passivation layer, then the fabrication method comprises: forming the first electrode layer and the TFT on the base substrate first; then coating a passivation layer film on the substrate and fabricating the passivation layer with the via hole through a patterning process, the via hole in the passivation layer being formed above the drain electrode. Finally, steps S6-S10 are performed sequentially to fabricate the second electrode layer, which may be connected to the drain electrode by way of the via hole in the passivation layer. In this case, the insulation layer is the passivation layer; or the insulation layer is the gate insulation layer and the passivation layer.

An embodiment of the invention further provides a display device comprising the array substrate of the above embodiment. The display device may be a liquid crystal display, a liquid crystal television, a digital camera, a mobile phone, a tablet PC and any product or component having a display function.

In the above embodiments of the invention, the protrusions and the base substrate are formed separately. However, in other embodiments of the invention, the two may be formed integrally. For example, more than one grooves may be formed by digging a flat surface of the base substrate.

Figure 1:
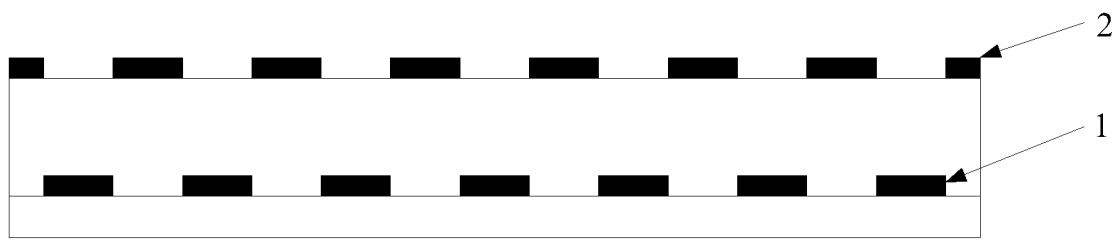
FIG. 1 schematically illustrates a cross section of a conventional array substrate.

The embodiments of the invention provide an array substrate, a method for fabricating the same and a display device, which form protrusions on the base substrate and place the first electrode layer in the grooves formed by the protrusions and dispose the second electrode above the protrusions, thereby realizing no overlapping between the common electrode and the pixel electrode. In contrast, a conventional array substrate is mostly as illustrated in FIG. 1, in which the common electrode 1 and the pixel electrode 2 are disposed alternately. Since both the common electrode 1 and the pixel electrode 2 are made of transparent electrode materials, it requires complicated fabrication process and high fabrication cost to guarantee no overlapping between the two electrode layers. In comparison with conventional arts, the invention ensures no overlapping between the two electrodes precisely by using the protrusions on the base substrate, thereby reducing the fabrication cost and the difficulty of the fabrication process.

What are described above is related to the illustrative embodiments of the disclosure only and not limitative to the scope of the disclosure; the scopes of the disclosure are defined by the accompanying claims.

What is claimed is:

1. A method for fabricating an array substrate, comprising forming gate lines, data lines and a TFT on a base substrate, the method further comprises:
   forming more than one protrusion disposed apart from each other on the base substrate;
   forming a first electrode layer, the first electrode layer comprises at least one first electrode strip disposed in a gap between adjacent protrusions;
   forming a second electrode layer, the second electrode layer comprises at least one second electrode strip disposed on the protrusions.

2. The method of claim 1, further comprising fabricating an insulation layer between the first electrode layer and the second electrode layer.

3. The method of claim 2, comprising:
fabricating more than one protrusion disposed apart from each other on the base substrate;
fabricating a first transparent conductive film on the substrate having the protrusions formed thereon and coating a first photoresist on the substrate having the first transparent conductive film fabricated thereon;
performing an ashing process on the first photoresist to form a pattern of the first photoresist which only covers gaps between the protrusions;
performing an etching process to remove the first transparent conductive film not covered by the pattern of the first photoresist;
performing a photoresist peeling process on the pattern of the first photoresist to form the first electrode layer comprising at least one first electrode strip;
fabricating an insulation layer on the base substrate having the first electrode layer formed thereon;
coating a second photoresist on the substrate having the insulation layer fabricated thereon, and performing an ashing process on the second photoresist to form a pattern of the second photoresist which only covers gaps between the protrusions;
fabricating a second transparent conductive film on the substrate having the pattern of the second photoresist formed thereon, and then removing the pattern of the second photoresist and the second transparent conductive film on the pattern of the second photoresist through a photoresist peeling process to form the second electrode layer comprising at least one second electrode strip.

4. The method of claim 1, wherein the protrusions fabricated on the base substrate are equally spaced apart from each other.

5. The method of claim 1, wherein a material of the protrusion is transparent resin material, and a thickness of the protrusion is larger than that of the first electrode.

6. The method of claim 2, wherein the TFT comprises a gate electrode, a gate insulation layer, an active layer, a source electrode and a drain electrode;
the insulation comprises at least one of the gate insulation layer or a passivation layer;
the first electrode layer is connected to the drain electrode, or the second electrode layer is connected to the drain electrode.

7. The method of claim 2, wherein the protrusions fabricated on the base substrate are equally spaced apart from each other.

8. The method of claim 2, wherein a material of the protrusion is transparent resin material, and a thickness of the protrusion is larger than that of the first electrode.

9. The method of claim 3, wherein the TFT comprises a gate electrode, a gate insulation layer, an active layer, a source electrode and a drain electrode;
the insulation comprises at least one of the gate insulation layer or a passivation layer;
the first electrode layer is connected to the drain electrode, or the second electrode layer is connected to the drain electrode.

10. The method of claim 3, wherein the protrusions fabricated on the base substrate are equally spaced apart from each other.

11. The method of claim 3, wherein a material of the protrusion is transparent resin material, and a thickness of the protrusion is larger than that of the first electrode.

12. The method of claim 4, wherein a material of the protrusion is transparent resin material, and a thickness of the protrusion is larger than that of the first electrode.

13. The method of claim 6, wherein the protrusions fabricated on the base substrate are equally spaced apart from each other.

14. The method of claim 6, wherein a material of the protrusion is transparent resin material, and a thickness of the protrusion is larger than that of the first electrode.

* * * * *